United States Patent
Eifuku et al.

(10) Patent No.: US 6,179,198 B1
(45) Date of Patent: Jan. 30, 2001

(54) METHOD OF SOLDERING BUMPED WORK BY PARTIALLY PENETRATING THE OXIDE FILM COVERING THE SOLDER BUMPS

(75) Inventors: Hideki Eifuku, Omuta; Mitsuru Ozono, Chikushino; Tadahiko Sakai; Shoji Sakemi, both of Fukuoka, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 08/927,476

(22) Filed: Sep. 11, 1997

(30) Foreign Application Priority Data

Sep. 18, 1996 (JP) .................................................. 8-245848
Oct. 11, 1996 (JP) .................................................. 8-269586

(51) Int. Cl.$^7$ ............................ B23K 31/02; B23K 31/12
(52) U.S. Cl. ...................................... 228/180.22; 228/103
(58) Field of Search ............................ 228/180.22, 180.1, 228/180.21, 179.1, 44.3, 103

(56) References Cited

U.S. PATENT DOCUMENTS 5,249,450 * 10/1993 Wood et al. .
5,351,876 * 10/1994 Belcher et al. .................. 228/180.22
5,438,020 * 8/1995 Grancher et al. ...................... 437/183
5,456,404 * 10/1995 Robinette, Jr. et al. .............. 228/104
5,487,999 * 1/1996 Farnworth .
5,541,525 * 7/1996 Wood et al. .......................... 324/755
5,611,481 * 3/1997 Akamatsu et al. ............... 228/180.22
5,615,824 * 4/1997 Fjelstad et al. .................. 228/180.22
5,616,520 * 4/1997 Nishiuma et al. .................... 438/125
5,634,267 * 6/1997 Farnworth et al. ..................... 29/840
5,709,336 * 1/1998 Ingraham et al. .................... 228/116
5,789,278 * 4/1998 Akram et al. ......................... 438/118

* cited by examiner

*Primary Examiner*—Patrick Ryan
*Assistant Examiner*—Carlos J. Gamino
(74) *Attorney, Agent, or Firm*—Stevens, Davis, Miller & Mosher, L.L.P.

(57) ABSTRACT

A method of soldering a bumped work without using flux is provided by the steps of vacuum-sucking the bumped work on a head, pressing a bump against a pad of another work, causing a projection of the bump to partially break an oxide film on the solder portion, to pierce it, and to be placed thereon, and cooling and solidifying the molten solder portion. The surface of the solder portion is coated by the oxide film as a hard shell, so that, even if the bump is firmly pressed against the solder portion, the solder of the solder portion does not flow sidewise, and a solder bridge is not produced.

6 Claims, 7 Drawing Sheets

METHOD OF SOLDERING BUMPED WORK BY PARTIALLY PENETRATING THE OXIDE FILM COVERING THE SOLDER BUMPS

BACKGROUND OF THE INVENTION

1. Field of the Invention

The present invention relates to a method of soldering a bump of a bumped work to a pad of another work, and, more particularly, to a method of soldering a bump of a bumped electronic component on a pad of a circuit board.

2. Description of the Prior Arts

Soldering is conventionally performed between a bumped electronic component such as a flip chip and a circuit board such as a printed circuit board as follows. First, flux is applied on the surface of a bump formed on the bumped electronic component, or of a solder portion formed on the pad of the circuit board. Then, the bump is placed on the solder portion to mount the bumped electronic component on the circuit board. Subsequently, the circuit board is fed into a heating furnace to heat the solder portion to a temperature at its melting point (typically, about 200° C.) or higher for melting it, and then to cooling the solder portion so as to solidify it. In this procedure the bumped electronic component is mounted on the circuit board. Thereafter, a conductivity test is conducted for examining whether or not the bump of the bumped electronic component is properly soldered on the pad of the circuit board. The conductivity test is typically performed by attaching a probe of the tester to a terminal of the circuit board to check the conductivity. If the results of the conductivity test are not acceptable, a repair work is performed on the bumped electronic component. In the repair work, the circuit board mounted with the bumped electronic component is heated to remelt the solder portion, thereby removing the bumped electronic component from the circuit board. Once the bumped electronic component is removed, a part of the solder portion remains affixed to the pad. Then, the solder portion on the pad is scraped off with a tool or the like. After the solder portion is scraped off, a solder portion of a suitable amount is formed again on the pad. When the correction of the circuit board is completed with the above procedure, the bumped electronic component is mounted again on the circuit board.

However, a problem associated with the conventional method is that the remolten solder on the solder portion flows sidewise, and adjacent solder portions connect each other to cause the formation of a solder bridge, leading to short-circuiting. The reason therefor lies in the following.

Since the solder portion (alloy of low melting point metals such as Pb and Sn, i.e. lead and tin) formed on the pad of the circuit board is easily oxidized when it contacts air, an oxide film has been formed on the surface of the solder portion. The oxide film hinders wettability of the solder, and causes defective conductivity between the bump and the pad on the circuit board.

Then, the wettability of solder is conventionally improved by applying flux on the bump or solder portion. When the flux is used, the oxide film can be removed in heating and melting the solder portion, whereby the wettability of solder is improved to firmly solder the bump on the pad. However, if the oxide film is removed by using the flux, the fluidity of solder increases, so that adjacent solder portions connect each other to cause a solder bridge.

Since the flux has properties which deteriorate a circuit pattern on the circuit board, the conventional soldering method requires a step for washing and removing the flux after the bump is soldered on the pad. Thus, another problem associated with the conventional method is the number of steps required.

Furthermore, another problem associated with the conventional method for conducting a repair is that it is complicated, which requires much labor and a number of steps.

SUMMARY OF THE INVENTION

A first object of the present invention is to provide a method of soldering a bump of a bumped work on a pad of another work without using flux, so that good conductivity can be attained, yet without the formation of a solder bridge.

A second object of the present invention is to provide a method of mounting a bumped electronic component which facilitates the performance of a repair work if the quality of the soldering of the bump is not acceptable work.

The present invention can provide the method including the steps of pressing a projection projected downward from a bump of a bumped work against a solder portion formed on a pad of another work to partially break an oxide film on the solder portion with the projection, heating and melting the solder portion at a temperature equal to or lower than the melting point of the bump and the oxide film, and solidifying it.

In a constitution of the present invention, the projection of the bump breaks the oxide film on the surface of the solder portion, so that sufficient conductivity can be provided between the bump and the pad of the other work. In addition, since flux is not used, the oxide film on the surface of the solder portion is broken only at an area broken through by the projection of the bump, and the other area of the oxide film remains on the surface of the solder portion. Then, since the melting temperature of the oxide film is much higher than that of the solder portion, the oxide film is not melted even when the solder portion is heated and melted, and is in a state where the remolten and fluidized solder portion is coated by a hard shell. Therefore, there is no possibility that adjacent solder portions connect with each solder to cause a solder bridge.

The present invention can provide alternatively a method including the steps of placing a bump on a solder portion before heat treatment formed on a pad of a circuit board so as to press the bumped electronic component against a circuit board, thereby partially breaking an oxide film on the surface of the solder portion with the bump to contact the bump with the solder portion, attaching a probe of a tester to a terminal of the circuit board to check conductivity, and heating the bumped electronic component while pressing it against the circuit board to solder the bump to the pad.

In the alternate constitution of the invention, when the bumped electronic component is firmly pressed against the circuit board, the bump partially breaks the oxide film on the surface of the solder portion and contacts the solder portion. Therefore, the conductivity test can be conducted before the soldering process for heating the solder portion to melt and solidifying it, so that a repair work can be easily performed if the results of the test are unacceptable.

DETAILED DESCRIPTION OF THE PREFERRED EMBODIMENTS

[Embodiment 1]

Figure 1:
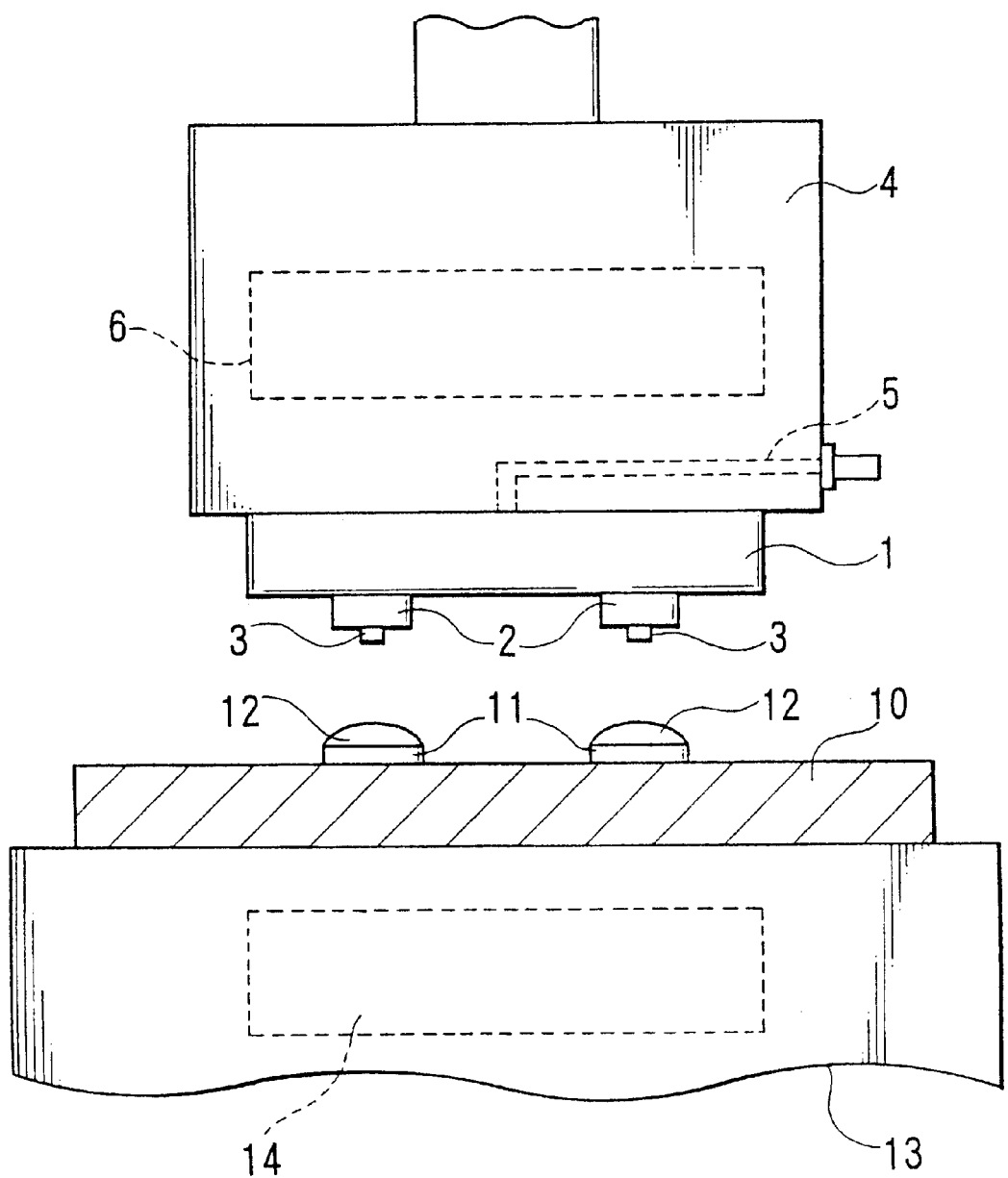
FIG. 1 is a front view of a mounting apparatus for mounting a bumped electronic component according to an embodiment of the present invention.
Figure 2:
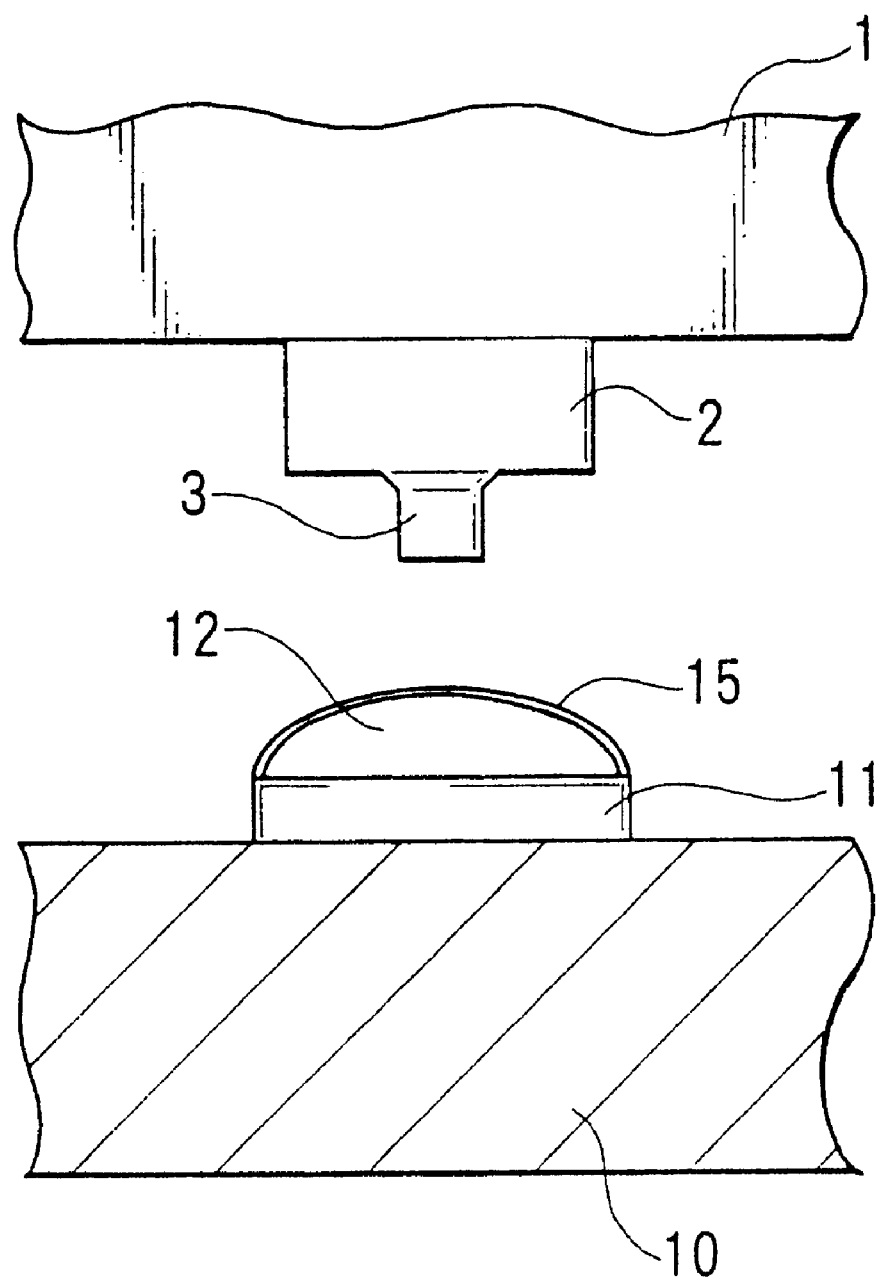
FIG. 2 is an illustration of a step of soldering a bumped electronic component according to the embodiment of the present invention.
Figure 3:
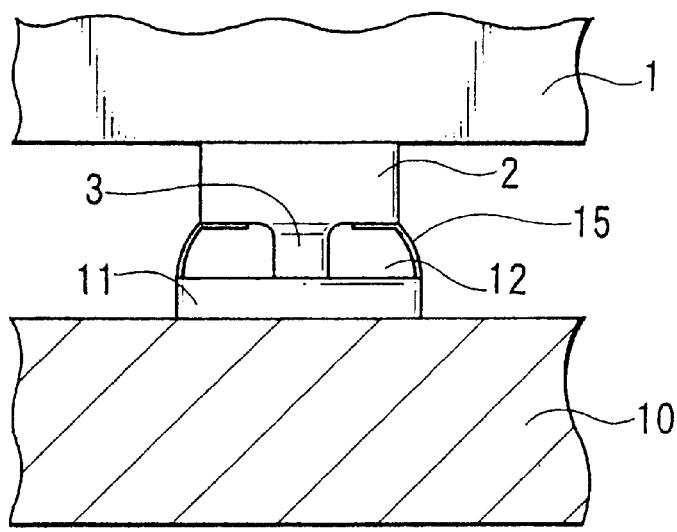
FIG. 3 is an illustration of a step of soldering a bumped electronic component following the step of FIG. 2 according to the embodiment of the present invention.
Figure 4:
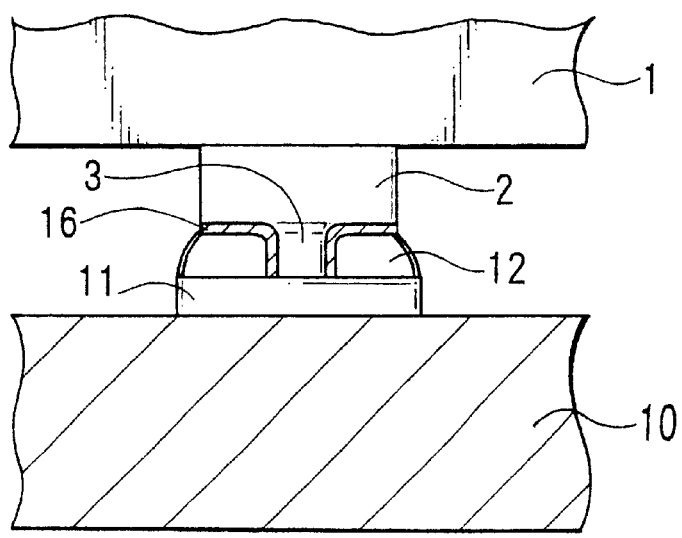
FIG. 4 is of an illustration of a step of soldering a bumped electronic component following the step of FIG. 3 according to the embodiment of the present invention.

Now, embodiment 1 of the present invention is described with reference to the drawings. FIG. 1 is a front view of a mounting apparatus for mounting a bumped electronic component according to embodiment 1 of the present invention. FIGS. 2, 3 and 4 are views of a process of soldering the bumped electronic component.

First, the mounting apparatus for mounting the bumped electronic component is described with reference to FIG. 1. In the figure, reference numeral 1 denotes an electronic component as a bumped work, on which a plurality of bumps 2 are projectedly provided. Although there are two bumps 2 in FIG. 1, a large number of bump 2 are typically formed with a narrow pitch. A projection 3 projects downward from the bump 2.

Now, a method for forming the bump is briefly described. The methods for forming the bump are known to include a method using a electroconductive ball, and a method using a wire. The former is a method disclosed in Japanese Patent Unexamined Publication No. 7-302814 and the like, in which an electroconductive ball is mounted on a pad, and melted and solidified by heating to form a bump. The latter is a method disclosed in Japanese Patent Unexamined Publication No. 4-37034 and the like, in which a wire is introduced through a capillary tool, a ball being formed on the lower end of wire by electric spark, the ball being bonded on a pad of a circuit board, then the wire being pulled upward, and cut near the bonding point.

The method using the electroconductive ball enables it to form a bump with a clear sphere. However, in the method using the wire, since the wire is pulled up and cut near the bonding point, the bump would have a projection (tail) projected upward. Thus, the bump 2 with the projection 3 shown in FIG. 1 is formed by the bump forming method using a wire. Of course, it may be formed by any other method.

In FIG. 1, the bumped electronic component 1 is vacuum-sucked to the bottom surface of a head 4. A suction channel 5 is formed in the head 4, and connected to a vacuum unit (not shown). As the vacuum unit is driven, the bumped electronic component 1 is vacuum-sucked to the bottom surface of the head 4. In addition, the head 4 contains a heater 6 therein. The head 4 is horizontally and vertically moved by means (not shown).

There is provided a circuit board 10 such as a printed circuit board that is another work. A solder portion 12 is formed on a pad 11 of a circuit pattern on the circuit board 10. The solder portion 12 is an alloy of low melting point metals such as lead and tin, and is formed on the pad 11 by soldering means or the like. The circuit board 10 is positioned on a table 13. The table 13 is an XY table, and can horizontally move the circuit board 10. In addition, the table 13 contains a heater 14 therein.

There is constituted the mounting apparatus for mounting the bumped electronic component as above. Now, the soldering method is described. FIGS. 2 to 4 sequentially shows a process including the steps of the soldering process. First, as shown in FIG. 2, the bump 2 is aligned to the solder portion 12 to position the bump 2 just above the solder portion 12. An oxide film 15 is produced on the surface of the solder portion 12 by contacting with the air.

Then, as shown in FIG. 3, the head 4 is lowered to press the bump 2 against the solder portion 12. In this occasion, the bump 2 is heated by heat conduction from the heater 6, and the solder portion 12 is heated by heat conduction from the heater 14. Here, the bump 2 is heated to a temperature of about 300° C. by the heater 6. However, since the bump 2 is made of gold or copper with a high melting point, it is not melted at the temperature of about 300° C. On the other hand, the solder portion 12 is heated to and melted at the temperature of about 220° C. by heat conduction from the heater 14. Here, the solder portion 12 has a melting point of about 200° C.

Further, the oxide film 15 produced on the surface of the solder portion 12 typically has a melting point of 500° C. or higher which is considerably higher than the melting point of the solder. Therefore, while the solder portion 12 is melted and fluidized when it is heated to the temperature of about 220° C., the oxide film 15 is not melted, and coats the molten solder portion 12 just as a hard shell to prevent the solder portion 12 from flowing sidewise.

Under such condition, if the bump 2 is pressed against the solder portion 12 as shown in FIG. 3, the projection 3 partially breaks through the oxide film 15 to partially break it, and enters into the inside of the solder portion 12. In this case, desirably, if the lower end of the projection 3 is placed on the pad 11 as shown in FIG. 3 by firmly pressing the bump 2 against the solder portion 12, conductivity can be further sufficiently assured between the bump 2 and the pad 11. In the conventional method, when the bump is firmly pressed against the solder portion, the solder portion flows out sidewise as it is melted and fluidized, so that solder of adjacent solder portions tends to connect each other, leading to a solder bridge. Thus, it has been difficult to place the bump on the pad of the circuit board, thereby assuring sufficient conductivity. Timing may be reversed for breaking through and partially breaking the oxide film 15 with the projection 3, and for melting the solder portion 12. Rather, the oxide film 15 can be more effectively broken when it is broken before the solder portion 12 is melted.

As described above, according to the present method, sufficient conductivity can be assured by firmly pressing the bump 2 against the solder portion 12. In addition, since, in the conventional method, a solder bridge tends to be easily produced if the bump is firmly pressed against the solder portion, it is necessary to rather carefully control the pressing force. On the other hand, since, according to the present invention, it is sufficient to press the bump against the solder portion with appropriately strong force, the pressing force can be more easily controlled for its magnitude than the conventional method.

Then, once the solder portion 12 is cooled and solidified by releasing the pressing state with the head 4, as shown in FIG. 4, the bump 2 is bonded on the pad 11 by the solder portion 12. Reference numeral 16 denotes alloy produced at a boundary between the bump 2 and the solder portion 12.

[Embodiment 2]

Figure 5A:
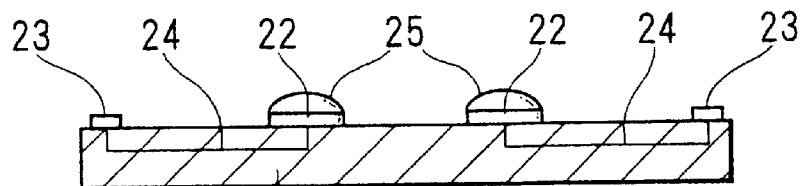
FIGS. 5A to 5C are illustrations of a method for mounting the bumped electronic component according to the embodiment of the present invention.
Figure 5B:
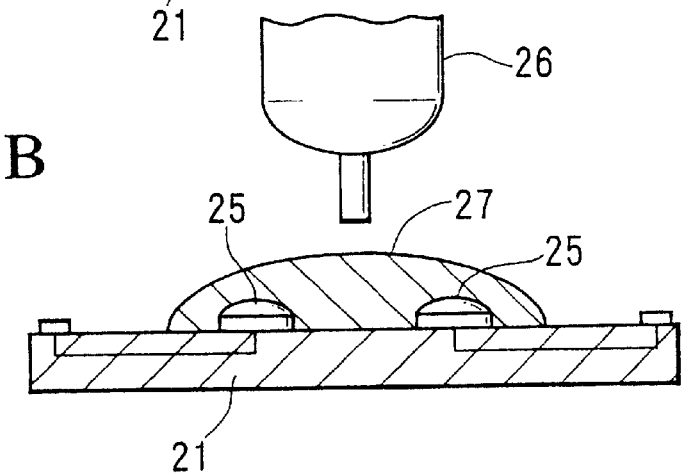
Figure 5C:
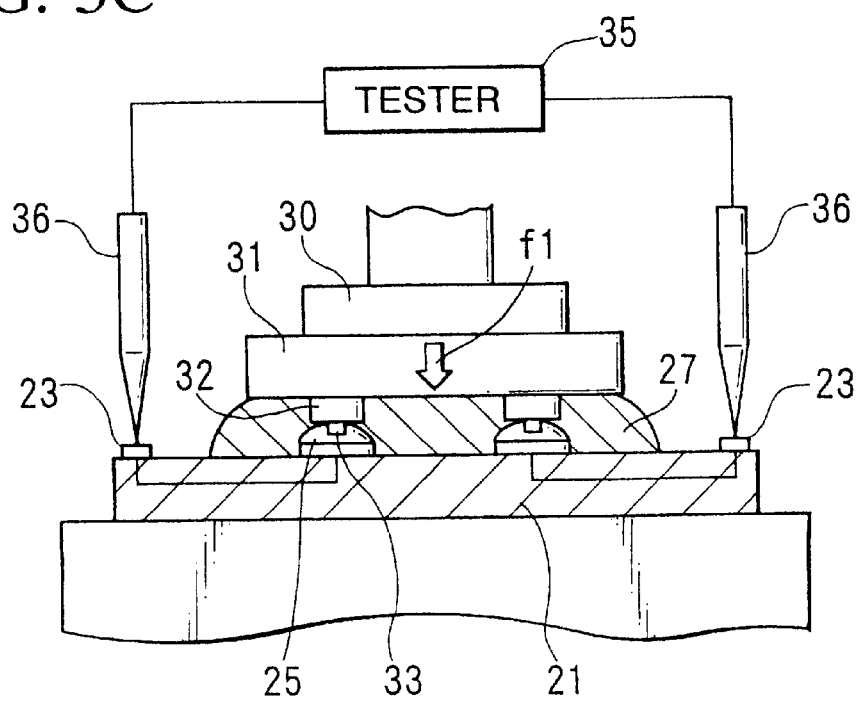
Figure 6A:
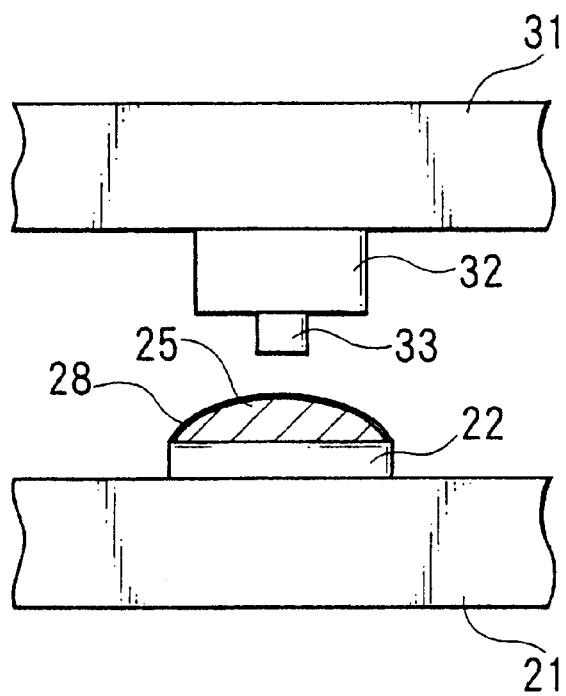
FIGS. 6A and 6B are a partial enlarged view of a bump and a solder portion in the method of mounting the bumped electronic component according to the embodiment of the present invention.
Figure 6B:
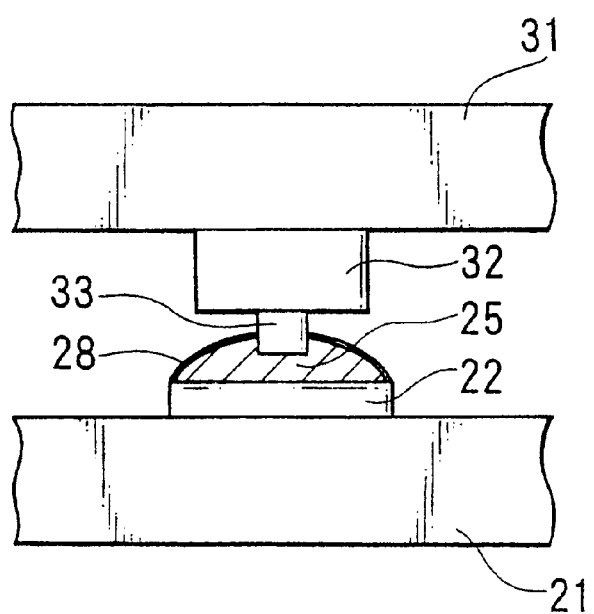
Figure 7:
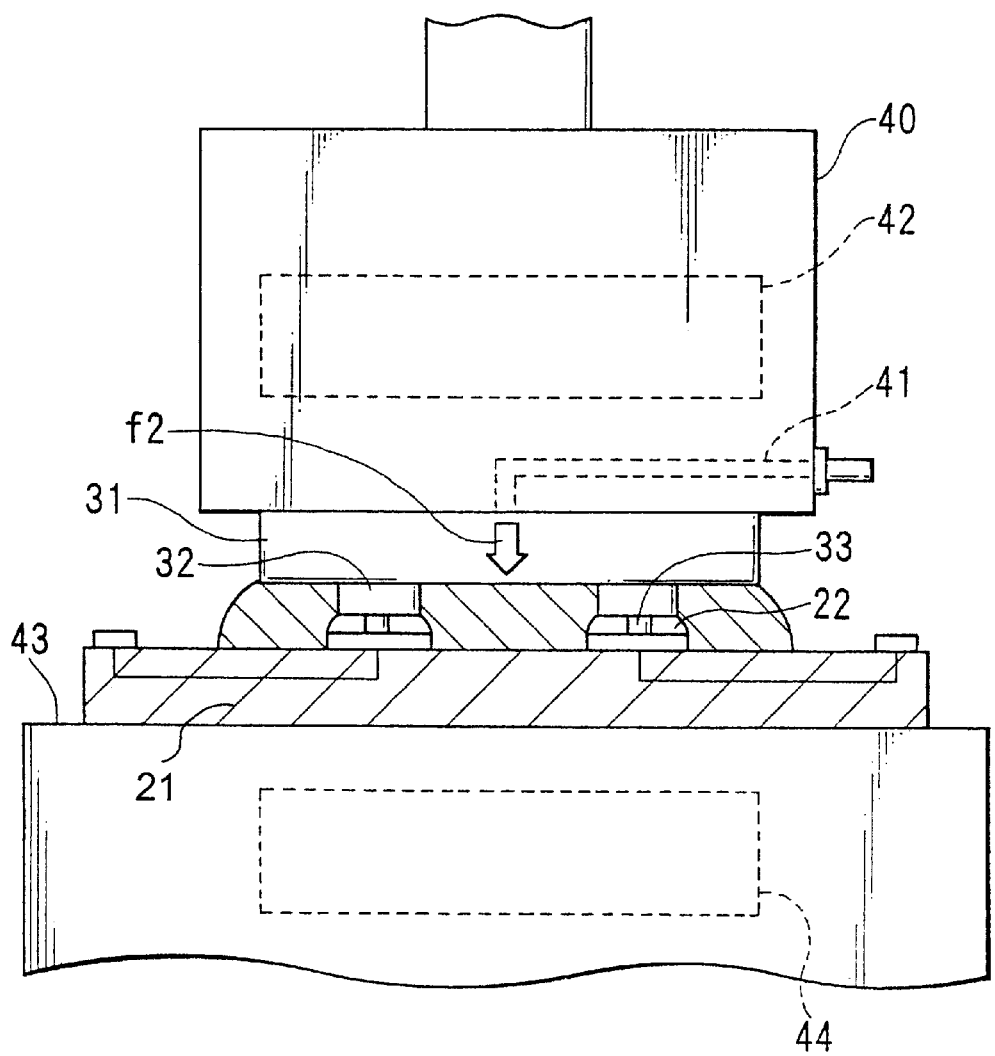
FIG. 7 is a front view of a mounting apparatus for mounting a bumped electronic component according to an alternate embodiment of the present invention.
Figure 8:
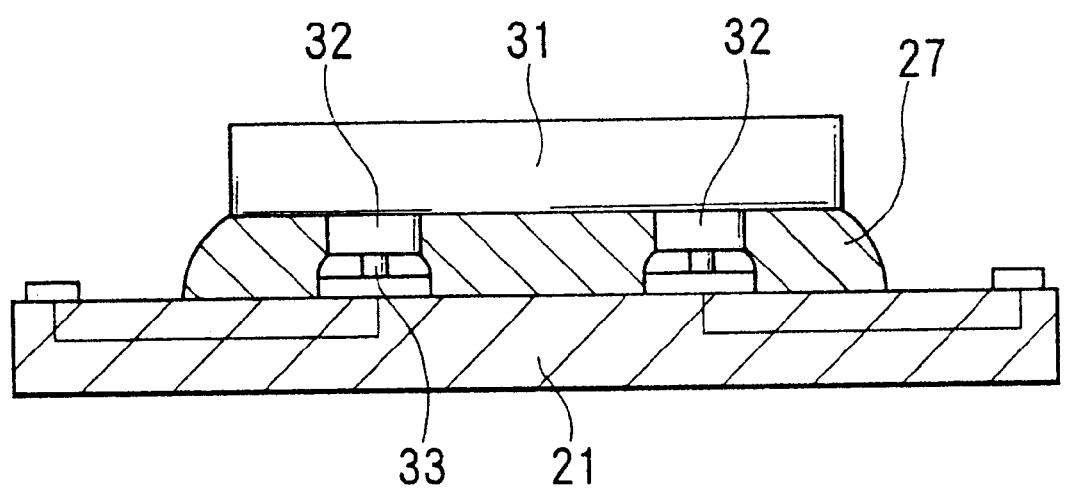
FIG. 8 is a sectional view of the mounting apparatus for mounting a bumped electronic component according to the alternate embodiment of the present invention.

Now, embodiment 2 of the present invention is described with reference to the drawings. FIGS. 5A to 5C illustrate a method of mounting a bumped electronic component according to embodiment 2 of the present invention. FIGS. 6A and 6B are partial enlarged views of the bump and the solder portion in the method of mounting the bumped electronic component. FIG. 7 is a front view of an apparatus for mounting the bumped electronic component, and FIG. 8 is a sectional view of the bumped electronic component as mounted.

First, the mounting method is described with reference to FIGS. 5A–5C, and 6A and 6B. In FIG. 5A, on the top surface of a circuit board 21 there are formed a pad 22 of a circuit pattern and a terminal 23 for testing conductivity. The circuit board 21 is a printed circuit board. The pad 22 is connected to the terminal 23 with a lead wire 24. In addition, a solder portion 25 is formed on the pad 22. The solder portion 25 is formed by using a solder plating means or solder leveler means. The solder portion 25 is an alloy of soft metals with low melting points such as lead and tin.

Then, as shown in FIG. 5B, bond 27 is supplied from a dispenser 26, and applied to the circuit board 21 to coat the solder portion 25. Then, as shown in FIG. 5C, the bumped electronic component 31 is held by a head 30 by vacuum-sucking it to the head 30 to place the bump 32 on the solder portion 25, whereby the bumped electronic component 31 is firmly pressed against the circuit board 21 for the conductivity test. The conductivity test is conducted by attaching a probe 36 of a tester 35 to the terminal 23 for checking conduction.

FIGS. 6A and 6B show an operation of pressing the bump 32 of the bumped electronic component 31 against the solder portion 25 by lowering the head 30. However, the bond 27 is not shown in FIGS. 6A and 6B. As can be seen in the figures, an oxide film 28 is produced on the surface of the solder portion 25 by making it contact with the air. This oxide film 28 has high electric resistance, and disturbs the conductivity test. Then, the oxide film 28 is broken through and partially broken with a projection 33 projected downward from the bump 32 by firmly pressing the projection 33 against the solder portion 25, thereby causing the projection 33 to directly contact the solder portion 25. Then, the conductivity test shown in FIG. 5C is conducted in such state. Of course, the bond 27 is uncured, and the solder portion 25 is not heat-treated. As described above, if the bump 32 has the projection 33, the oxide film 28 can be surely broken with the projection 33.

Now, a method of forming the bump is briefly described. Methods of forming the bump are known to include a method using a conductive ball, and a method using a wire. The former is a method disclosed in Japanese Patent Unexamined Publication No. 7-403824 and the like, in which a electroconductive ball is mounted on a pad, and melted and solidified by heating to form a bump. The latter is a method disclosed in Japanese Patent Unexamined Publication No. 4-37044 and the like, in which a wire is introduced through a capillary tool, a ball being formed on the lower end of wire by electric spark, the ball being bonded on a pad of a circuit board, then the wire being pulled upward, and cut near the bonding point.

The method using the electroconductive ball enables it to form a bump with a clear sphere. However, in the method using the wire, since the wire is pulled up and cut near the bonding point, the bump would have a projection (tail) projected upward. Thus, the bump 32 with the projection 33 shown in FIGS. 6A and 6B is formed by the bump forming method using a wire. Of course, it may be formed by any other method.

If the result of the conductivity test shown in FIG. 5C is unacceptable, the bumped electronic component 31 is removed from the circuit board 21 for re-mounting of the bumped electronic component 31. Since, in conducting the conductivity test shown in FIG. 5C, the bond 27 is uncured, and the solder portion 25 is not yet heat-treated, the bumped electronic component 31 can be easily removed from the circuit board 21 for repair.

If the result of the conductivity test shown in FIG. 5C is acceptable, the bumped electronic component 31 is soldered on the circuit board 21 by a method described later. That is, as shown in FIG. 7, the bumped electronic component 31 is vacuum-sucked to and held on the bottom surface of a suction head 40 to firmly pressing the bumped electronic component 31 against the circuit board 21. A suction channel 41 is formed in the suction head 40. When the suction channel 41 is vacuum-sucked by a vacuum unit (not shown), the bumped electronic component 31 is vacuum-sucked to the bottom surface of the suction head 40. In addition, the suction head 40 contains a heater 42 therein. A base plate 43 is provided for mounting the circuit board 21, and contains a heater 44 therein.

If it is assumed that the pressing force is f2 in this case, and the pressing force in the conductivity test shown in FIG. 5C is f1, f2 is arranged to be larger than f1. This enables it to further enhance plastic breakage of the oxide film 28 on the surface of the solder portion 25 with the bump 32, whereby the bump 32 is sufficiently contacted to the solder portion 25. In this case, desirably, the bumped electronic component 31 is firmly pressed against the circuit board 21 so that the projection 33 directly contacts the pad 22. This enables the bump 32 to provide a conduction with the pad 22. Since the pressing force f1 is relatively small in the conductivity test shown in FIG. 5C, the projection 33 does not contact the pad 22 as shown in the figure.

When the bumped electronic component 31 is mounted on the circuit board 21 as described above, the heater 44 is activated. Heat from the heater 44 melts the solder portion 25, and cures the bond 27. Then, the bumped electronic component 31 is soldered on the circuit board 21 by releasing the vacuum suction state to facilitate raising the suction head 40, and by cooling and solidifying the molten solder portion 25. FIG. 8 shows the circuit board 21 soldered with the bumped electronic component 31.

According to the present invention, since the oxide film on the surface of the solder portion is broken by the projection of the bump, it is possible to provide sufficient conductivity between the bump and the pad of the circuit board. In addition, since flux is not used, the oxide film on the surface is broken only at an area broken through by the projection of the bump, and the other area of the oxide film remains on the surface of the solder portion and coats the molten solder as a hard shell. Thus, it is possible to eliminate a situation such as that where the solder flows sidewise to cause the formation of a solder bridge.

Furthermore, according to the present invention, since, before the solder portion is heat-treated to solder the bump, the conductivity test is performed by firmly pressing the bump against the solder portion to partially break the oxide film, thereby causing the bump to make direct contact with the solder portion, the conductivity test can be accurately performed. In addition, if the results of the conductivity test are acceptable, the bumped electronic component can be easily removed from the circuit board for repair.

What is claimed is:

1. A method of soldering a bump of a bumped electronic component on a pad of a circuit board having a solder portion whose surface is covered with an oxide film without using flux, said method comprising the steps of:
   a) pressing said bump against said pad until a projection of said bump partially breaks an oxide film of a solder portion formed on said pad;
   b) heating and melting said solder portion to form a molten solder portion with a temperature lower than a melting point of said bump and said oxide film; and
   c) cooling and solidifying said molten solder portion.

2. The method of soldering a bump as set forth in claim 1, wherein said electronic component is suctioned to the bottom surface of a head in a mounting apparatus, and said pad is positioned on a table that contains a heater of said mounting apparatus therein.

3. The method of soldering a bump as set forth in claim 1, wherein the projection of said bump partially breaks the oxide film of said solder portion before said solder portion is heated and melted.

4. The method of soldering a bump as set forth in claim 1, wherein a conductivity test is conducted between said bump and said pad after the projection of said bump is pressed against said solder portion to partially break said oxide film.

5. A method of soldering a bump of a bumped electronic component on a pad of a circuit board having a solder portion whose surface is covered with an oxide film without using flux, said method comprising the steps of:
   pressing a projection projected downward from the bump of said bumped electronic component against a solder portion formed on the pad of the circuit board;
   partially breaking an oxide film on a surface of said solder portion with said projection;
   heating and melting said solder portion to form a molten solder portion with a temperature lower than a melting point of said bump and said oxide film; and
   cooling and solidifying said molten solder portion.

6. A method of mounting a bumped electronic component for soldering a bump of a bumped electronic component on a pad of a circuit board having a solder portion whose surface is covered with an oxide film, said method comprising the steps of:
   placing said bump on a solder portion formed on the pad of said circuit board and prior to heat treatment pressing said bumped electronic component against said circuit board until a projection of said bump partially breaks an oxide film on a surface of said solder portion with said bump, thereby contacting said bump to said solder portion;
   checking conductivity by attaching a probe of a test to a terminal of said circuit board in the above state; and
   heating said bumped electronic component while pressing it against said circuit board to solder said bump on said pad.

* * * * *